US006730617B2

(12) United States Patent
Carter

(10) Patent No.: US 6,730,617 B2
(45) Date of Patent: May 4, 2004

(54) METHOD OF FABRICATING ONE OR MORE TIERS OF AN INTEGRATED CIRCUIT

(76) Inventor: Kenneth Raymond Carter, 2000 Randolph Dr., San Jose, CA (US) 95128

( * ) Notice: Subject to any disclaimer, the term of this patent is extended or adjusted under 35 U.S.C. 154(b) by 48 days.

(21) Appl. No.: 10/132,530

(22) Filed: Apr. 24, 2002

(65) Prior Publication Data

US 2003/0203649 A1 Oct. 30, 2003

(51) Int. Cl.[7] .............................................. H01L 21/31
(52) U.S. Cl. .................. 438/780; 438/781; 438/759; 438/645
(58) Field of Search ................... 438/780, 760, 438/782, 127, 759, 781, 626, 645

(56) References Cited

U.S. PATENT DOCUMENTS

| | | | |
|---|---|---|---|
| 4,153,654 A | 5/1979 | Maffitt et al. | 264/1 |
| 5,141,785 A | 8/1992 | Yoshinada et al. | 428/1 |
| 5,206,117 A | 4/1993 | Labadie et al. | 430/325 |
| 5,498,445 A | 3/1996 | Steiner et al. | 427/162 |
| 5,928,767 A | 7/1999 | Gebhardt et al. | 428/209 |
| 5,965,679 A | 10/1999 | Godschalx et al. | 526/281 |
| 6,093,636 A | 7/2000 | Carter et al. | 438/623 |
| 6,143,643 A | 11/2000 | Carter et al. | 438/622 |
| 6,177,360 B1 | 1/2001 | Carter et al. | 438/781 |
| 6,280,794 B1 * | 8/2001 | Tu et al. | 427/379 |
| 6,288,188 B1 | 9/2001 | Godschalx et al. | 526/285 |
| 6,407,006 B1 * | 6/2002 | Levert et al. | 438/761 |

FOREIGN PATENT DOCUMENTS

| | | | |
|---|---|---|---|
| WO | WO - 00/54107 A1 | 9/2000 | G03F/7/00 |
| WO | WO - 01/20402 A1 | 3/2001 | G03F/7/00 |

OTHER PUBLICATIONS

L. T. Romankiw, *Patterning by "Rubber Stamping"*, Research Disclosure, Sep. 1986, No. 269, p. 26968.

Marc Husemann et al., *Surface–Initiated Polymerization for Amplification of Self–Assembled Monolayers Patterned by Microcontact Printing*, Angew. Chem. Int. Ed. vol. 38, No. 5, 1999, pp. 647–649.

Ingo Martini et al., *Fabrication of quantum point contacts by imprint lithography and transport studies*, J. Vac. Sci. Technol. B vol. 18, No. 6, Nov/Dec 2000, pp. 3561–3563.

D. L. White et al., *Novel alignment system for imprint lithography*, J. Vac. Sci. Technol. B vol. 18, No. 6, Nov/Dec 2000, pp. 3552–3556.

T. Bailey et al., *Step and flash imprint lithography: Template surface treatment and defect analysis*, J. Vac. Sci. Technol. B vol. 18, No. 6, Nov/Dec 2000, pp. 3572–3577.

* cited by examiner

*Primary Examiner*—Caridad Everhart
(74) *Attorney, Agent, or Firm*—Daniel E. Johnson

(57) ABSTRACT

A process for forming a portion of an integrated circuit includes placing a layer of material on a substrate, in which the material includes a polymeric composition or a precursor to a dielectric composition. The material is contacted with a stamping surface having relief structures that define a pattern, so that a patterned layer is formed as a result of the contact, which may include heating the material to mold it. A metal film or layer is then deposited onto the patterned layer. The metal can then be planarized to form a layer of an integrated circuit. A decomposable or sacrificial polymer is preferably included in the material, so that porous dielectric material is formed, thereby leading to a lower dielectric constant of the end product.

30 Claims, 5 Drawing Sheets

METHOD OF FABRICATING ONE OR MORE TIERS OF AN INTEGRATED CIRCUIT

TECHNICAL FIELD

The invention relates generally to processes for manufacturing an integrated circuit device and for manufacturing at least one tier (or layer) of such a device. More specifically, the invention relates to processes for forming patterned layers of (low dielectric constant) insulating materials using a stamping process, in which the dielectric layer may be formed, for example, from organosilicate or organic polymer material (or oligomeric precursors).

BACKGROUND

There is a ongoing desire in the microelectronics industry to increase the circuit density in multilevel integrated circuit devices (e.g., memory and logic chips), thereby increasing their performance and reducing their cost. Accordingly, there is a trend to not only reduce the minimum feature size on the chip (e.g., the circuit linewidth), but also to decrease the dielectric constant of the dielectric material interposed between chip features, thereby permitting closer spacing of the circuit lines without leading to an undesirable increase in crosstalk and capacitive coupling. In addition, there is a desire in the industry to reduce the dielectric constant of the materials utilized in the back end of the line (BEOL) portion of integrated circuit devices, which contain input/output circuitry, in order to reduce the requisite drive current and power consumption of the device. The most commonly used dielectric is silicon dioxide, which has the requisite mechanical and thermal properties to withstand the processing operations and thermal cycling associated with semiconductor manufacturing. However, silicon dioxide has a dielectric constant of about 4.0; dielectric materials having a dielectric constant of 3.0 or less would be preferred.

One class of materials that has been used as a dielectric is the polysilsesquioxane family of materials, also known as spin-on-glasses (SOG). These materials offer ease of processing: a thin film of such a material can be spun from solution onto a substrate, followed by thermal curing of the film to effect solvent removal and croslinking, thereby resulting in a solid phase dielectric film on the substrate. One complication with using SOG to produce dielectric layers is that fabricating thin wiring within a dielectric thin film is generally complex. Creating even a one-layer metal/dielectric structure may involve a multistep process. See, for example, U.S. Pat. No. 6,143,643 to Carter et al., in which the SOG composition is coated on a substrate and then cured, a photoresist is applied over the cured composition, photolithography is employed followed by selective etching of the photoresist, and metal is deposited followed by chemical/mechanical processing of the metal.

Another class of useful dielectric materials includes polyimides, polybenzoxazoles, and other high temperature thermosets (e.g., Dow Chemical Company's SiLK brand of semiconductor dielectric resin). Polyimides are particularly useful as an interlayer dielectric material for insulating the conductor wiring interconnecting the chips on a multichip module, a process known as "thin film" wiring. Multichip modules represent an intermediate level of packaging between the chips and the circuit board, and are made up of multiple layers of power, signal, and ground planes that deliver power to the chips and distribute the input/output signals between chips on the module or to and from the circuit board. Polyimides are attractive since they usually have dielectric constants of about 3.0–3.8 and mechanical and thermal properties sufficient to withstand the processing operations (including the thermal cycling) associated with semiconductor manufacturing.

Generally, the state of the art related to the fabrication of integrated circuits entails a series of complex optical lithography steps. Although efforts are underway to employ contact printing methods in the field of microelectronics, much of this effort has dealt with the printing of resist materials. (See, for example, PCT WO 00/54107A1 to Willson et al.) A general process of forming heterogeneous structures using stamping techniques has been disclosed in PCT WO 01/20402 to Jacobson et al. However, this reference does not teach, for example, how to form integrated circuit devices having low dielectric materials.

There remains a need for a versatile and efficient "stamping" process to produce low dielectric constant insulating materials in an integrated circuit, especially in view of the usefulness of dielectric materials to so many aspects of integrated circuits, including chips (e.g., chip back end of line, or "BEOL"), thin film packages, printed circuit boards, dielectric interlayers, passivation layers, alpha particle barriers, and stress buffers. Such a process would ideally permit an increase in manufacturing throughput while reducing cost.

SUMMARY OF THE INVENTION

One preferred implementation of the invention is a process for forming a layer of an integrated circuit that includes low dielectric constant material. Another preferred implementation of the invention is a process for forming a multi-tier integrated circuit device that includes (i) a substrate, (ii) interconnecting metallic circuit lines positioned on (or even within) the substrate, and (iii) low dielectric constant material in contact with the circuit lines (e.g., over and/or between the circuit lines). The dielectric material preferably comprises a porous material that has been patterned by a stamping process. Such a porous dielectric material has a dielectric constant lower than the analogous non-porous material. Accordingly, there is disclosed herein an improved process for the fabrication of integrated circuits that involves the pattering of dielectric material.

One implementation of the invention is a process for forming a portion of an integrated circuit. The process includes positioning a layer of material on a substrate, in which the material includes a polymeric composition and a decomposable (sacrificial) polymer. A patterned stamp is brought into contact with the layer to mold the layer, and then the stamp is removed from the molded layer, thereby leaving a pattern in the molded layer. By decomposing the sacrificial polymer, porous dielectric material is formed. The process also includes depositing metal onto the patterned layer and planarizing the metal to form a portion of an integrated circuit. In one preferred implementation, the molding includes inducing a chemical change in the polymeric composition, and the polymeric composition may advantageously include a precursor to dielectric material. In a preferred implementation, the sacrificial polymer is decomposed while the stamp is in contact with the molded layer. In another preferred implementation, the metal is planarized to form a tier of an integrated circuit, and the process is repeated to form one or more additional tiers of an integrated circuit.

Another implementation of the invention is a process for forming a portion of an integrated circuit. The process includes positioning a layer of material on a substrate, in which the material includes a precursor to a dielectric composition and a decomposable (sacrificial) polymer. The process further includes bringing a patterned stamp in contact with the layer to mold the layer and curing the precursor to the dielectric composition, thereby forming a molded layer of dielectric material. The process also includes removing the stamp from the molded layer of dielectric material, thereby leaving a pattern in the molded layer, and decomposing the sacrificial polymer to form porous dielectric material. A portion of an integrated circuit is then formed by depositing metal onto the patterned layer and planarizing the metal. In one implementation of the process, the curing includes heating the material while the material is in contact with the stamp. The dielectric composition may include an inorganic polymeric material or an organic polymeric material. In a preferred implementation of the process, the sacrificial polymer is decomposed while the stamp is in contact with the molded layer. The process advantageously further includes planarizing the metal to form a tier of an integrated circuit, and the process may be repeated to form a second tier of an integrated circuit, in which the second tier is adjacent to the first tier.

Yet another implementation of the invention is a process for forming a portion of an integrated circuit. The process includes positioning a layer of material on a substrate, contacting the material with a surface having relief structures therein, and imparting a pattern to the material through this contact to form a patterned layer, wherein the pattern is determined by the relief structures. The process further includes decomposing a sacrificial polymer present in the material to form porous dielectric material and depositing metal onto the patterned layer to form a portion of an integrated circuit. The material may include a precursor to a dielectric composition and may further include a solution in which a polymeric composition is present.

Still another implementation of the invention is an improved method for forming an integrated circuit, in which the improvement includes using a patterned stamp to form a molded layer of dielectric material, and then decomposing a sacrificial polymer within the layer to form porous dielectric material.

A more complete description of the invention is presented in the detailed description and the accompanying drawings.

BRIEF DESCRIPTION OF THE DRAWINGS

FIGS. 1–8 illustrate a first implementation of the invention, in which:

FIG. 1 shows a substrate;

FIG. 2 shows a layer of material on top of the substrate;

FIG. 3 shows a patterned stamp being brought into contact with the material;

FIG. 4 shows the patterned stamp in contact with the material;

FIG. 5 shows the stamp being released from the substrate;

FIG. 6 shows a patterned layer formed by the stamp, and how heat may be applied to form porous dielectric material in the layer;

FIG. 7 is a cross sectional view showing a film of metal added to the patterned dielectric material;

FIG. 8 is a cross sectional view showing a tier of an integrated circuit following a planarization procedure;

FIGS. 9–13 are cross sectional views of a second implementation of the invention, in which:

FIG. 9 shows a layer of material on top of a substrate that has metallic studs therein;

FIG. 10 shows a patterned layer on top of the substrate;

FIG. 11 shows a film of metal added to the patterned layer;

FIG. 12 shows a tier of an integrated circuit formed from a planarization procedure;

FIG. 13 shows a layer of material that has been deposited on the tier of FIG. 12, so that an additional tier can be formed;

DETAILED DESCRIPTION OF THE INVENTION

Figure 1:
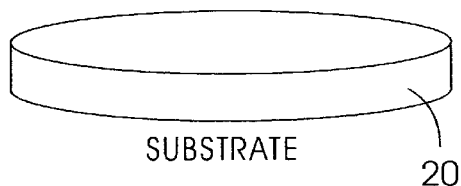

Preferred embodiments of the present invention relate to processes for manufacturing one or more tiers of an integrated circuit device, and are now described in connection with the accompanying figures. FIG. 1 shows a substrate 20, which may include silicon, silicon dioxide, glass, silicon nitride, ceramics, aluminum, copper, gallium arsenide, or another suitable substance known to those skilled in the art.

Figure 2:
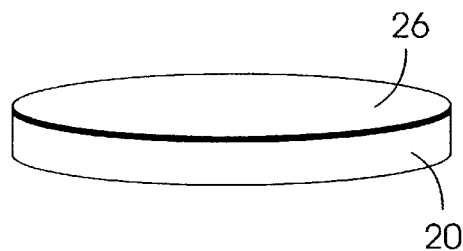

As illustrated in FIG. 2, a layer 26 of material is deposited onto the substrate 20. The layer 26 may deposited, for example, through spin casting, meniscus-bead coating, dip coating, spray coating, or doctor blading. The material making up the layer 26 is selected so that, for preferred processes as described herein, dielectric material is left behind at the end of the process. Thus, the layer 26 may include a polymeric material or a precursor to a dielectric composition, which may be (prior to being deposited on the substrate 20) advantageously dissolved in a suitable solvent such as dimethyl propylene urea (DMPU), NMP, PM-acetate, y-butyrolactone or the like. For example, the material may include a spin-on, high temperature polymer (such as a polyimide), an organic thermosetting material (such as Dow Chemical Company's SiLK product described in U.S. Pat. Nos. 5,965,679 and 6,288,188 to Godschalx et al.), an inorganic or organic polysilica (e.g., a polysilsesquioxane), such as those described in U.S. Pat. Nos. 6,143,643 and 6,177,360 to Carter et al.). Suitable dielectric precursors may include a poly(amic) acid, a poly (amic) ester, and a low molecular weight polysilsesquioxane that can be converted to a highly crosslinked, high molecular weight polysilsesquioxane. If a polymeric material is deposited on the substrate 20, it may (depending upon the polymeric material selected) undergo some degree of crosslinking or, alternatively, it might not undergo any significant cross linking, even upon curing. Other materials suitable for deposition on the substrate 20 include those known to one skilled in the art, such as those described in the Background. Alternatively, the material in the layer 26 may include a thermoplastic material, as described below in greater detail. In addition, the layer 26 preferably includes a decomposable (sacrificial) polymer so that the dielectric end product is porous. This decomposable or sacrificial polymer can include linear macromolecules, hyperbranched, dendritic macromolecular structures, star-branched polymers, block copolymers, or cross-linked polymeric nanospheres (nanoparticles); these sacrificial polymers are commonly referred to as porogens. In a particularly preferred embodiment, the dielectric precursor solution includes Dow Chemical Company's SiLK and a decomposable porogen, such as polyester, polystyrene, poly(a-methylstyrene), polyacrylate, or poly-methacrylate (as described in U.S. Pat. No. 6,093,636 to Carter et al. entitled "Process for manufacture of integrated circuit device using a matrix comprising porous high temperature thermosets", which is hereby incorporated by reference). Such a solution can produce material having a dielectric constant of approximately 1.9 or less.

Figure 3:
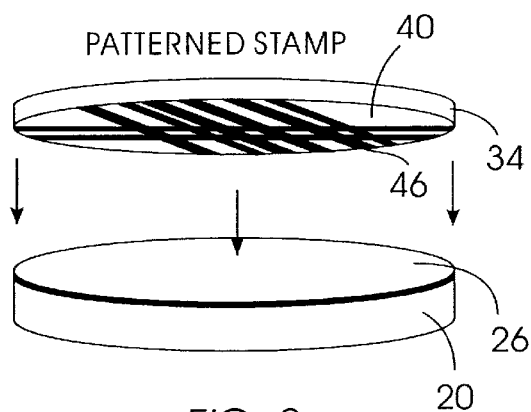

As indicated in FIG. 3, the layer 26 is then brought into contact with a stamp 34 having an appropriately patterned stamping surface 40. The surface 40 advantageously includes a pattern of relief structures 46 (or features) having characteristic dimensions ranging, for example, from 20 nanometers to 100 microns, and more preferably from 20 to 80 nanometers. When the stamp 34 is brought into contact with the layer 26 on the substrate 20, the relief structures 46 impart a pattern to the layer 26 that corresponds to the inverse of the pattern on the surface 40. The stamp 34 is advantageously comprised of material that is sufficiently rigid to impart a pattern to the layer 26. Preferred stamp materials include metal, silicon, an organic polymer, a siloxane polymer, borosilicate glass, a fluorocarbon polymer, and combinations thereof.

Figure 4:
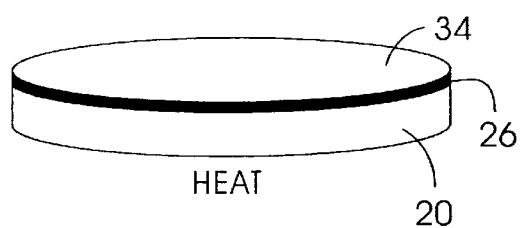

As indicated in FIG. 4, heat may be applied to the substrate 20 and/or the stamp 34 so that heat is transferred to the layer 26, thereby effecting solvent removal and/or partial or full curing of the material in the layer 26. For example, if an SOG resin is used, cross condensation of the polysilica silyl reactive groups can be expected to occur. The material in the layer 26 may advantageously include a base such as an amine or Bronsted base to lower the condensation temperature. In this example, the base catalyzes both condensation extension of the polysilica and any cross condensation with the sacrificial polymer, thereby resulting in a lower initial cure temperature. If an amine is used, it may be advantageously be an organic amine, preferably one that has a boiling point greater than 150 C. and is removable by heating upon completion of the reaction. One suitable base is N-methyldiethanolamine (having a boiling point of about 246–248 C.), and other suitable bases are known to those skilled in the art, such as those disclosed in U.S. Pat. No. 5,206,117 to Labadie et al. Other catalysts which facilitate the condensation may also be used.

If the material in the layer 26 is a pressure sensitive material (such as a thermoplastic) rather than a heat sensitive material, applying pressure alone may be sufficient to mold the layer 26 (e.g., by inducing a chemical change in the material) and thereby impart a pattern to it. Preferred thermoplastics may include polyimides and norbornenes.

Figure 5:
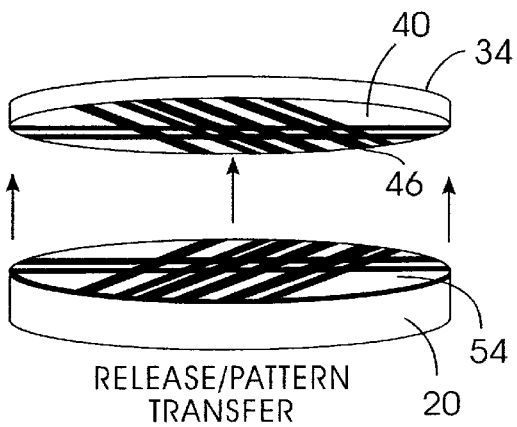
Figure 6:
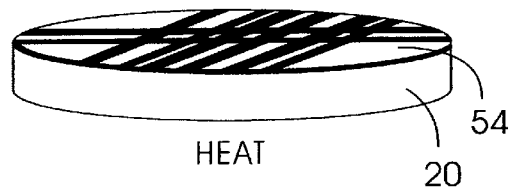

As indicated in FIG. 5, the stamp 34 may then be released from the substrate. This leaves, as shown in FIG. 6, a patterned layer 54 of dielectric material, which preferably includes a decomposable or sacrificial polymer. Further thermal treatments may then be employed to effect the decomposition of the sacrificial polymer within the rigid dielectric matrix (e.g., the sacrificial polymer may be dispersed within the matrix), thereby forming a porous dielectric material. Thermal treatments may also be employed to ensure that the patterned dielectric layer 54 has been completely cured.

Alternatively, applying heat to the substrate 20 and/or the stamp 34 (as in FIG. 4) can both cure the material in the layer 26, and subsequently, decompose the sacrificial polymer to form a porous dielectric material. Decomposition of the sacrificial polymer results in pores or microcavities within the rigid dielectric matrix, so that the dielectric constant of the resulting porous material is less than that of the analogous homogeneous, non-porous material. The material preferably has a non-interconnected porous structure, with the pores having a characteristic dimension (size) much less that that of the critical features in the corresponding integrated circuit. For example, the pores preferably have a diameter less than 10 nanometers, and more preferably less than 5 nanometers.

Figure 7:
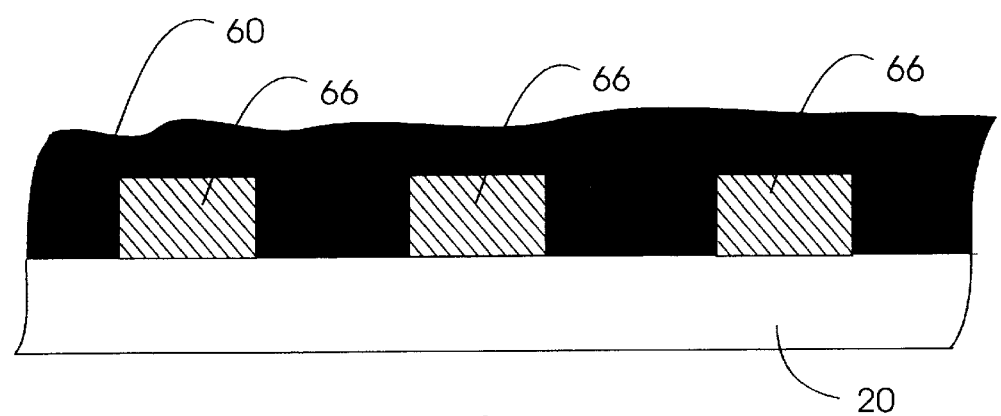

As indicated in FIG. 7, the process of forming a tier (or layer) of an integrated circuit involves depositing a metallic film 60 around the dielectric material 66, which has now been formed into a pattern defined by the relief structures 46 in the patterned layer 54. Preferred metals for the metallic film 60 include copper, tungsten and aluminum. The metallic film 60 may be deposited onto the patterned dielectric material 66 by methods known to those skilled in the art, such as chemical vapor deposition (CVD), plasma enhanced CVD, electro and electroless deposition, sputtering and the like.

Figure 8:
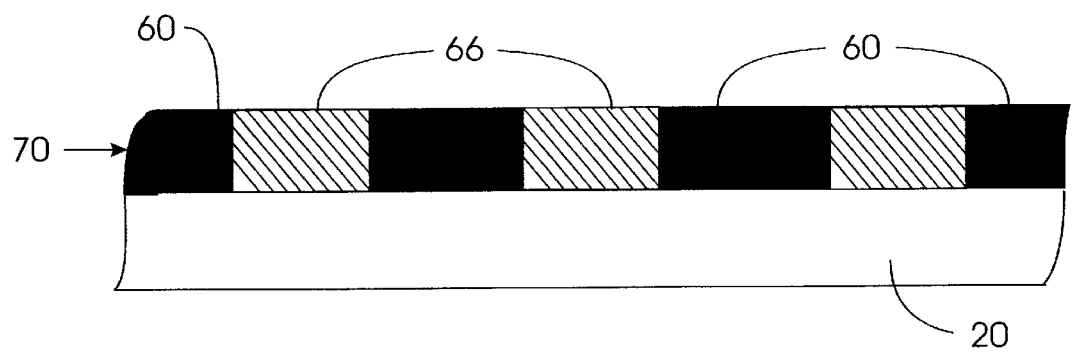

As indicated in FIG. 8, excess metal deposited onto the patterned dielectric material 66 is then removed. That is, the metal 60 is advantageously planarized so that the remaining metal is generally level with the patterned dielectric material 66, with the metal and dielectric material forming a tier 70 or layer. Planarization can be accomplished using chemical/mechanical polishing or selective wet or dry etching. The planarized layer 70 can then be polished using chemical/mechanical polishing techniques known to those skilled in the art.

Figure 9:
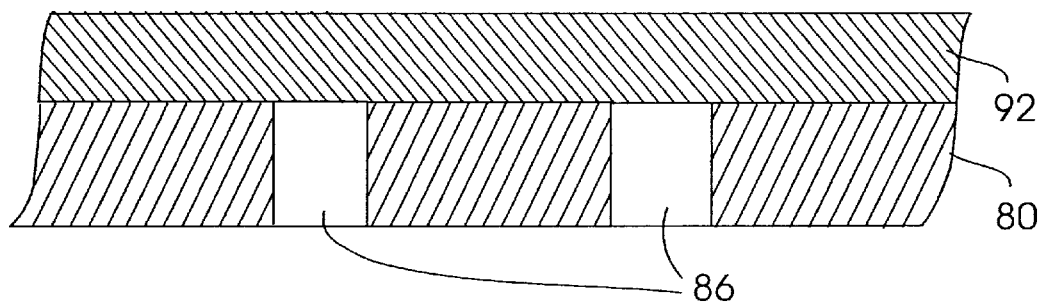
Figure 10:
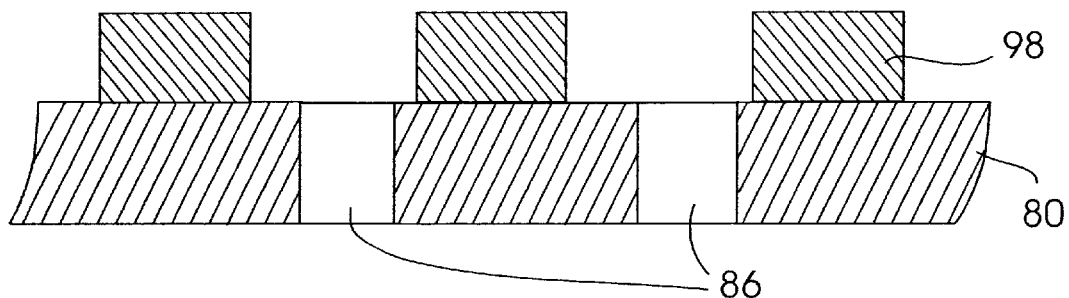
Figure 11:
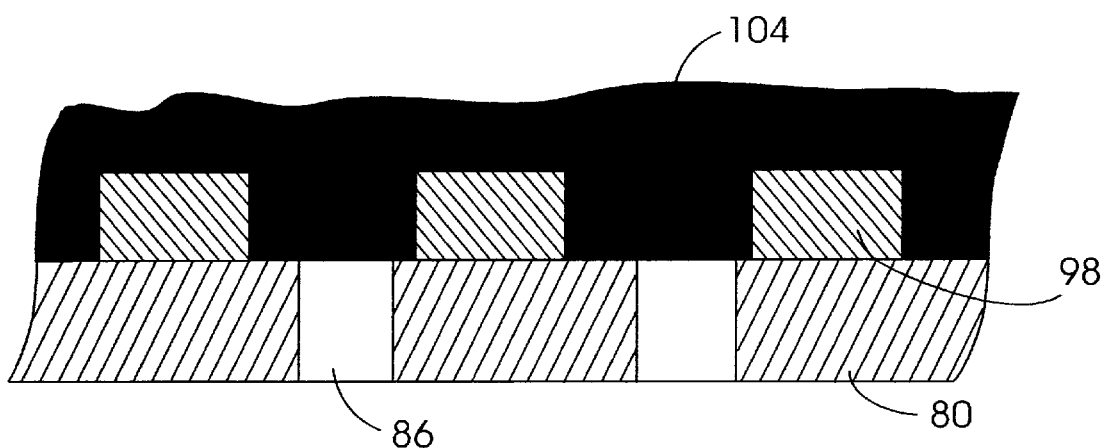
Figure 12:
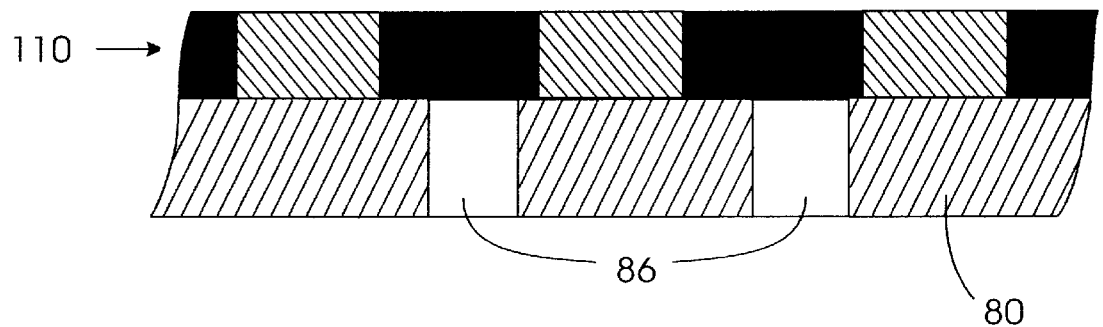
Figure 13:
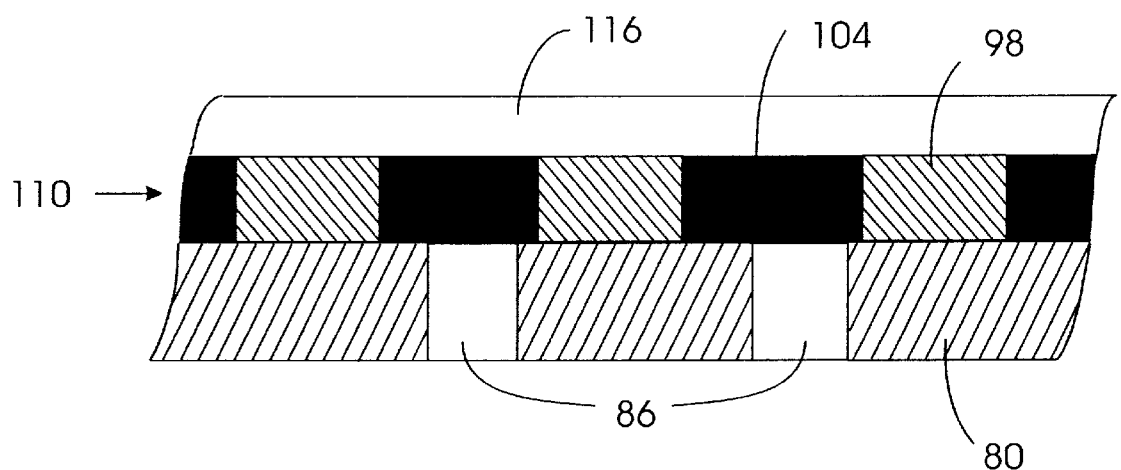

Procedures similar to those described above may be used to build one layer of an integrated circuit on top of another layer of an integrated circuit. Thus, in a multilayer integrated circuit device, an underlying layer of insulated, planarized circuit lines can function as a substrate. FIG. 9 shows a substrate 80 into which metallic studs 86 have been formed. A layer 92 of material (analogous to the layer 26) is deposited on the substrate 80 in a manner similar to that described above in connection with the layer 26. Using a patterned stamp and heat and/or pressure (depending upon the type of material used in the layer 26), patterned dielectric material 98 may be formed on the substrate 80, as shown in FIG. 10. After metal 104 is deposited onto the patterned dielectric material 98 (see FIG. 11), excess metal can be removed through a planarizing process to form a tier 110 (or layer) of an integrated circuit (see FIG. 12), followed by polishing of the planarized tier 110, as described above. As indicated in FIG. 13, additional tiers can then be constructed by repeating the process, i.e., by depositing another layer 116 of material (similar to the layer 92), and so on. The dielectric material 98 may also be advantageously planarized along with the metal 104, so that the tier 110 functions properly as a substrate for lithographic formation of the next layer of circuit lines. If a sacrificial polymer is included in one or more of the layers (layers 92, 116, or any subsequently added layers), thermal treatments may be employed to effect the decomposition of that sacrificial polymer within the rigid dielectric matrix, thereby forming a porous dielectric material. Thermal treatments may also be employed to ensure that the patterned dielectric layers have been completely cured.

When the patterned dielectric material 98 is formed as indicated in FIG. 10, the relief structures of the stamping surface (like those shown on the stamp 34) are brought into alignment with the positions of the metallic studs 86. Doing so ensures that the metallic studs 86 are properly interconnected with the deposited metal 104, so that the interconnected circuit lines distribute electrical signals properly throughout the device, and provide power input to and signal output from the device. Typically, an integrated circuit device will comprise multiple layers of circuit lines interconnected by vertically oriented metallic studs. Suitable metals for the circuit lines herein (e.g., the circuit lines that include the metallic studs 86 and the metal 104) may advantageously include an electrically conductive material such as copper, aluminum, tungsten, gold, silver, or alloys thereof. Optionally, the circuit lines herein may be coated with a metallic liner such as a layer of nickel, tantalum or chromium or other layers such as barrier or adhesion layers (e.g., SiN, TiN).

The alignment of the metallic studs 86 with the stamping surface 40 used to form the pattern in the patterned dielectric material 98, or more generally, the alignment of one tier with another tier (or with a substrate) may be accomplished using alignment procedures known to those in the art. (See, for example, "Novel Alignment Systems for Imprint Lithography", D. L. White et al., *J. Vac. Sci. Technol. B,* 2000, 18(6), 3552; "Fabrication of Quantum Point Contacts by Imprint Lithography and Transport Studies", I. Martini et al., R. *J. Vac. Sci. Technol. B,* 2000, 18(6), 3561; and "Step and Flash Imprint Lithography: Template Surface Treatment and Defect Analysis", T. Baily et al., *J. Vac. Sci. Technol. B,* 2000, 18(6), 3572.)

In one preferred technique, the alignment of the substrate 20 and the stamp 34 can be achieved using an optical mask aligner and/or modified lithographic stepper system (not shown). As in conventional lithography, the stamp 34 and the substrate 20 are aligned using reference marks on the stamp and many different alignment marks on the substrate 20. Proper alignment can be achieved by mounting the substrate 20 to a Z-translation stage (not shown) that also allows for rotational control in the X-Y plane. An optical camera system (not shown) is used to locate and align the marks on the substrate 20 and the stamp 34. To ensure proper alignment, a precalibration stage (not shown) enables parallel alignment of the stamp 34 and the substrate 20. Then, as the stamp 34 is brought into close proximity (e.g., on the order of nanometers) with the substrate 20, appropriate X-Y translation is applied to ensure correct alignment. Unlike alignment in conventional photolithography, there is less of a problem with any inaccuracies introduced by secondary reference marks, X-Y stage errors, or projection lens distortions. Accordingly, alignment during contact molding can be equal to or superior to that attainable in conventional photolithography.

The following example serves to exemplify the more generally described methods set forth above. It is presented for illustrative purposes only, and is not intended to restrict the scope of the invention.

EXAMPLE

Figure 14A:
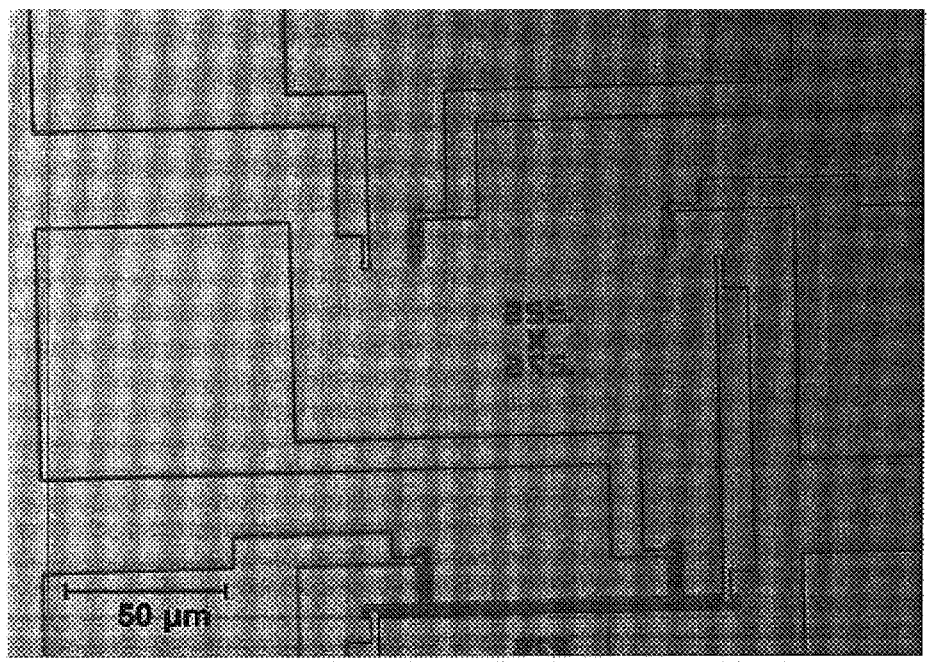
FIGS. 14A and 14B show, respectively, the surface of an acrylate stamp and patterned, porous dielectric material made with this stamp.
Figure 14B:
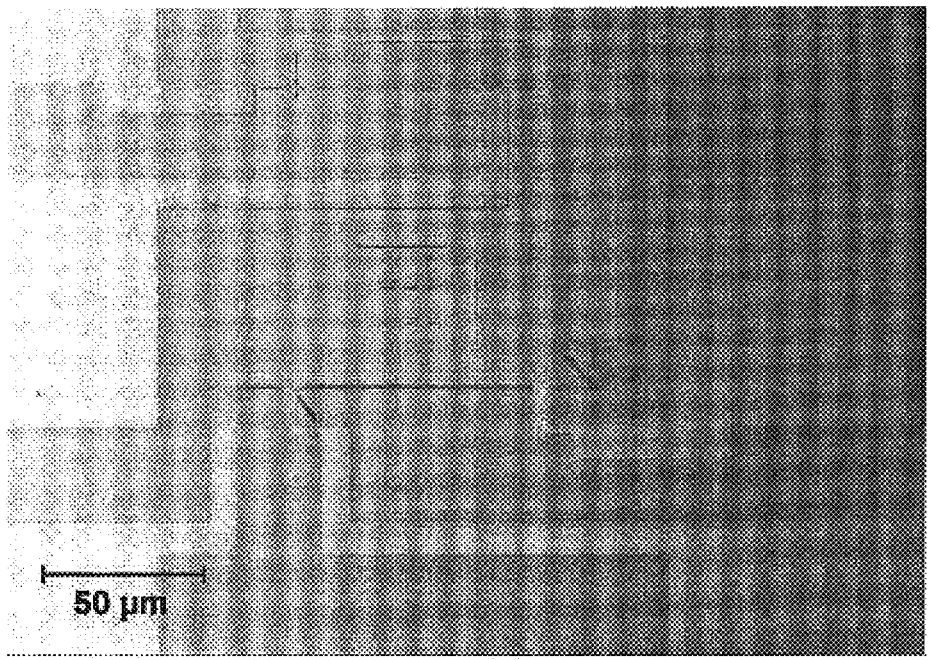

A resin composition was formulated with the following constituents: 89 parts propylene glycol propyl ether (solvent); 7.5 parts methylsilsesquioxane resin (dielectric matrix resin); 2.5 parts poly(dimethylaminoethylmethacylate-co-methylmethacrylate, 25:75) (porogen); 1 part N-methyldiethanolamine (base). The resin solution was spin-coated @ 4000 rpm onto a polished silicon wafer. The thin film was placed into contact with a stamp consisting of a patterned photopolymerized acrylate resin and put under 0.08 ATM of pressure. The silicon wafer was heated to 150 C. for 15 minutes. The pressure was removed, and the stamp released from the surface. The resin was further cured to 430 C. to effect complete resin cure and pore formation resulting from the decomposition of the porogen. Optical micrographs revealed excellent pattern transfer, as shown by the images in FIGS. 14A and 14B.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A process for forming a portion of an integrated circuit, comprising:
    positioning a layer of material on a substrate, wherein the material includes a polymeric composition and a sacrificial polymer;
    bringing a patterned stamp in contact with the layer to mold the layer;
    removing the stamp from the molded layer, thereby leaving a pattern in the molded layer;
    decomposing the sacrificial polymer to form porous dielectric material;
    depositing metal onto the patterned layer; and
    planarizing the metal to form a portion of an integrated circuit.

2. The process of claim 1, wherein said molding the layer comprises heating the layer while the layer is in contact with the stamp.

3. The process of claim 1, wherein the polymeric composition includes an inorganic polymeric material.

4. The process of claim 1, wherein the polymeric composition includes an organic polymeric material.

5. The process of claim 1, wherein said molding comprises inducing a chemical change in the polymeric composition.

6. The process of claim 1, wherein the polymeric composition includes a precursor to dielectric material.

7. The process of claim 1, wherein the sacrificial polymer is decomposed while the stamp is in contact with the molded layer.

8. The process of claim 1, wherein the metal is planarized to form a tier of an integrated circuit, the process further comprising repeating the procedure of claim 1 to form a second tier of an integrated circuit, the second tier being adjacent to the first tier.

9. The process of claim 1, wherein the stamp includes relief structures having characteristic dimensions ranging from 20 nanometers to 100 microns.

10. The process of claim 1, wherein the stamp includes relief structures having characteristic dimensions ranging from 20 nanometers to 80 nanometers.

11. A process for forming a portion of an integrated circuit, comprising:
    positioning a layer of material on a substrate, wherein the material includes a precursor to a dielectric composition and a sacrificial polymer;
    bringing a patterned stamp in contact with the layer to mold the layer;
    curing the precursor to the dielectric composition, thereby forming a molded layer of dielectric material;
    removing the stamp from the molded layer of dielectric material, thereby leaving a pattern in the molded layer;
    decomposing the sacrificial polymer to form porous dielectric material;
    depositing metal onto the patterned layer; and
    planarizing the metal to form a portion of an integrated circuit.

12. The process of claim 11, said curing comprising heating the material while the material is in contact with the stamp.

13. The process of claim 11, wherein the dielectric composition includes an inorganic polymeric material.

14. The process of claim 11, wherein the dielectric composition includes an organic polymeric material.

15. The process of claim 11, wherein the sacrificial polymer is decomposed while the stamp is in contact with the molded layer.

16. The process of claim 11, wherein the metal is planarized to form a tier of an integrated circuit, the process further comprising repeating the procedure of claim 9 to form a second tier of an integrated circuit, the second tier being adjacent to the first tier.

17. The process of claim 11, wherein the stamp includes relief structures having characteristic dimensions ranging from 20 nanometers to 100 microns.

18. The process of claim 11, wherein the stamp includes relief structures having characteristic dimensions ranging from 20 nanometers to 80 nanometers.

19. A process for forming a portion of an integrated circuit, comprising:

positioning a layer of material on a substrate;

contacting the material with a surface having relief structures therein;

imparting a pattern to the material through said contact to form a patterned layer, wherein the pattern is determined by the relief structures;

decomposing a sacrificial polymer present in the material to form porous dielectric material; and depositing metal onto the patterned layer to form a portion of an integrated circuit, wherein the pattern is preselected to correspond to the positions of interconnecting metallic circuit lines of the integrated circuit.

20. The process of claim 19, wherein the material includes a polymeric composition, said imparting a pattern including molding the polymeric composition.

21. The process of claim 20, wherein said molding comprises heating the polymeric composition.

22. The process of claim 20, wherein the polymeric composition is a thermoplastic material.

23. The process of claim 19, wherein the material includes a precursor to a dielectric composition.

24. The process of claim 19, wherein the material further includes a solution in which a polymeric composition is present.

25. The process of claim 19, wherein the relief structures have characteristic dimensions ranging from 20 nanometers to 100 microns.

26. The process of claim 19, wherein the relief structures have characteristic dimensions ranging from 20 nanometers to 80 nanometers.

27. A process for forming a portion of an integrated circuit, comprising:

positioning a layer of material on a substrate;

contacting the material with a surface having relief structures therein;

imparting a pattern to the material through said contact to form a patterned layer, wherein the pattern is determined by the relief structures;

decomposing a sacrificial polymer present in the material to form porous dielectric material;

depositing metal onto the patterned layer to form a portion of an integrated circuit; and planarizing the metal.

28. An improved method for forming an integrated circuit, wherein the improvement comprises:

using a patterned stamp to form a molded layer of dielectric material, wherein the pattern of the stamp is preselected to correspond to the positions of interconnecting metallic circuit lines of the integrated circuit; and decomposing a sacrificial polymer within the layer to form porous dielectric material.

29. The process of claim 28, wherein the stamp includes relief structures having characteristic dimensions ranging from 20 nanometers to 100 microns.

30. The process of claim 28, wherein the stamp includes relief structures having characteristic dimensions ranging from 20 nanometers to 80 nanometers.

* * * * *

UNITED STATES PATENT AND TRADEMARK OFFICE
CERTIFICATE OF CORRECTION

PATENT NO. : 6,730,617 B2 Page 1 of 1
DATED : May 4, 2004
INVENTOR(S) : Kenneth Carter It is certified that error appears in the above-identified patent and that said Letters Patent is hereby corrected as shown below:

<u>Column 9,</u>
Line 16, delete "9" and replace it with -- 11 --.

Signed and Sealed this

Twenty-eighth Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,730,617 B2 Page 1 of 1
APPLICATION NO. : 10/132530
DATED : May 4, 2004
INVENTOR(S) : Kenneth R. Carter It is certified that error appears in the above-identified patent and that said Letters Patent is hereby corrected as shown below:

<u>Title page,</u>
Insert Item:
-- [73]  Assignee:  International Business Machines Corporation, Armonk, NY (US) --.

Signed and Sealed this

Eleventh Day of July, 2006

JON W. DUDAS
*Director of the United States Patent and Trademark Office*